United States Patent
Chakraborty et al.

(10) Patent No.: US 11,041,904 B2
(45) Date of Patent: Jun. 22, 2021

(54) ZERO-PIN TEST SOLUTION FOR INTEGRATED CIRCUITS

(71) Applicant: QUALCOMM Incorporated, San Diego, CA (US)

(72) Inventors: Tapan Jyoti Chakraborty, San Diego, CA (US); Umesh Srikantiah, San Diego, CA (US); Rachana Rout, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 49 days.

(21) Appl. No.: 16/589,968

(22) Filed: Oct. 1, 2019

(65) Prior Publication Data
US 2021/0096182 A1   Apr. 1, 2021

(51) Int. Cl.
*G01R 31/317*   (2006.01)
*G01R 31/3177*   (2006.01)

(52) U.S. Cl.
CPC ... *G01R 31/31724* (2013.01); *G01R 31/3177* (2013.01); *G01R 31/31727* (2013.01)

(58) Field of Classification Search
CPC .......... G01R 31/31724; G01R 31/3177; G01R 31/31727
See application file for complete search history.

(56) References Cited

U.S. PATENT DOCUMENTS

2006/0156112 A1*   7/2006   Whetsel ........ G01R 31/318558
714/724

OTHER PUBLICATIONS

J. Jahangiri, N. Mukherjee, Wu-Tung Cheng, S. Mahadevan and R. Press, "Achieving High Test Quality with Reduced Pin Count Testing," 14th Asian Test Symposium (ATS'05), Calcutta, 2005, pp. 312-317, doi: 10.1109/ATS.2005.19. (Year: 2005).*
"IEEE Standard for Reduced-Pin and Enhanced-Functionality Test Access Port and Boundary-Scan Architecture," in IEEE Std 1149. 7-2009, vol. No., pp. 1-985, Feb. 10, 2010, doi: 10.1109/IEEESTD. 2010.5412866. (Year: 2010).*

* cited by examiner

*Primary Examiner* — Cynthia Britt
(74) *Attorney, Agent, or Firm* — Patterson+Sheridan, L.L.P.

(57) ABSTRACT

In some aspects, the present disclosure provides a method for testing an integrated circuit (IC). In some configurations, the method includes determining, by a test controller embedded in the IC, a change in operation of the IC from a normal mode to a test mode. The method also includes communicating, by the test controller to a chain of data storage elements in the IC: a first test signal configured to change an input/output (I/O) function of a first IC pin, and a second test signal configured to apply one of a plurality of test functions to each data storage element in the chain of data storage elements. The method also includes, receiving, via a second IC pin, a test clock signal configured to control a latch function of each data storage element in the chain of data storage elements.

20 Claims, 4 Drawing Sheets

ZERO-PIN TEST SOLUTION FOR INTEGRATED CIRCUITS

BACKGROUND

Field of the Disclosure

The present disclosure relates to zero-pin design for test (DFT) solutions for pin limited circuits.

Description of Related Art

Design-for-testability (DFT) refers to a technique for reducing the complexity associated with design testing by including test logic and access points for accessing such test logic within an integrated circuit device. Modern integrated circuits usually incorporate a variety of design-for-test (DFT) structures to enhance their inherent testability. Typically, the DFT structures are based on a scan design where scan test or automatic test pattern generation (ATPG) test data may be provided to a test pin or where a plurality of externally accessible scan chains may be embedded into the integrated circuit. Typically, scan test design is used in conjunction with fault simulation and ATPG method to generate manufacturing and diagnostic test patterns for production test and prototype debug processes.

To provide DFT functionality, a circuit may have a plurality of dedicated test pins, which can be accessed during a test mode and which may be tied to a logic level during normal (e.g., a standard operational mode of the IC), non-test operation. A multiplexer may be introduced to select between testing and non-testing modes and to provide a data pattern to an array output multiplexer.

Due to the rapid rate at which technology evolves, computing devices are increasingly dependent on testing solutions that reduce the number of dedicated pins for testing a circuit. Accordingly, systems and methods are needed for enabling DFT functionality with reduced pin count.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In certain aspects, the disclosure describes a method for testing an integrated circuit (IC). In some examples, the method includes determining, by a test controller embedded in the IC, a change in operation of the IC from a normal mode (e.g., a standard operational mode of the IC) to a test mode. In some examples, the method includes, communicating, by the test controller to a chain of data storage elements in the IC: a first test signal configured to change an input/output (I/O) function of a first IC pin, and a second test signal configured to apply one of a plurality of test functions to each of the data storage elements in the chain of data storage elements. In some examples, the method includes receiving, via a second IC pin, a test clock signal configured to control a latch function of each of the data storage elements in the chain of data storage elements.

In certain aspects, the disclosure describes an apparatus for testing an IC, comprising a memory and a test controller embedded in the IC and communicatively coupled to the memory. In some examples, the test controller is configured to determine a change in operation of the IC from a normal mode to a test mode. In some examples, the test controller is configured to communicate to a chain of data storage elements in the IC: a first test signal configured to change an I/O function of a first IC pin, and a second test signal configured to apply one of a plurality of test functions to each of the data storage elements in the chain of data storage elements. In some configurations, the test controller is configured to receive, via a second IC pin, a test clock signal configured to control a latch function of each of the data storage elements in the chain of data storage elements.

In certain aspects, the disclosure describes a non-transitory computer-readable storage medium containing a program which, when executed by one or more processors, performs operations for testing an IC. In some examples, the operations include determining a change in operation of the IC from a normal mode to a test mode. In some examples, the operations include communicating to a chain of data storage elements in the IC: a first test signal configured to change an I/O function of a first IC pin, and a second test signal configured to apply one of a plurality of test functions to each of the data storage elements in the chain of data storage elements. In some examples, the operations include receiving, via a second IC pin, a test clock signal configured to control a latch function of each of the data storage elements in the chain of data storage elements.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Disclosed herein are zero-pin design-for-test (DFT) solutions. Zero-pin DFT designs may be beneficially used for integrated circuits (ICs), such as pin-limited, mixed signal ICs. Pin-limited ICs typically include only enough pins to accommodate normal operation of the circuitry, with no additional pins for DFT purposes. Typically, this is due to the small size of communications devices, as well as increased functionality of the devices. Hence, in some examples, a pin-limited IC may relate to an IC that does not have capacity for dedicated testing pins and/or any other pins for additional functionality. One example of a pin-limited mixed signal IC may be a radio frequency (RF) front end block of a wireless communication system (e.g., a cell phone, a smart device, a tablet computer, a portable computer, or other user equipment). In some examples, a mixed signal IC.

As used herein, a "test" and "testing" may relate to a scanning technique used in DFT. The scan technique provides a method of setting and observing (e.g., testing) one or more data storage elements such as flip-flops in an IC. Notably, the terms "test" and "testing" may also relate to any other suitable methods and techniques for testing one or more data storage elements of an IC.

In some embodiments, an integrated test controller may be embedded in an IC so that pins of the IC can be reused for IC testing (e.g., a scan based test) without requiring any additional and/or test-dedicated pins at the IC. In some embodiments, the test controller includes a circuit configured to control a test operation in the IC. For example, the test controller may generate one or more signals configured to initiate a particular test mode (e.g., scan-in operations, capture operations, scan-out operations, etc.), and one or more signals configured to control an input/output (I/O) direction of one or more IC pins. As such, the test controller is configured to work together with additional signals (e.g., signals carrying test vectors) applied by external devices to one or more of the existing IC pins. It should be noted that, as used herein, the term "test mode" may be used interchangeably with the term "scan mode."

Thus, embodiments described herein enable full testing of an IC by repurposing existing pins of the IC for testing, such as by reusing two digital pins on pin limited digital circuits, so that dedicated and/or additional testing pins are not needed. By repurposing existing pins rather than adding additional pins for DFT purposes, embodiments described herein may be more space and cost efficient.

Figure 1:
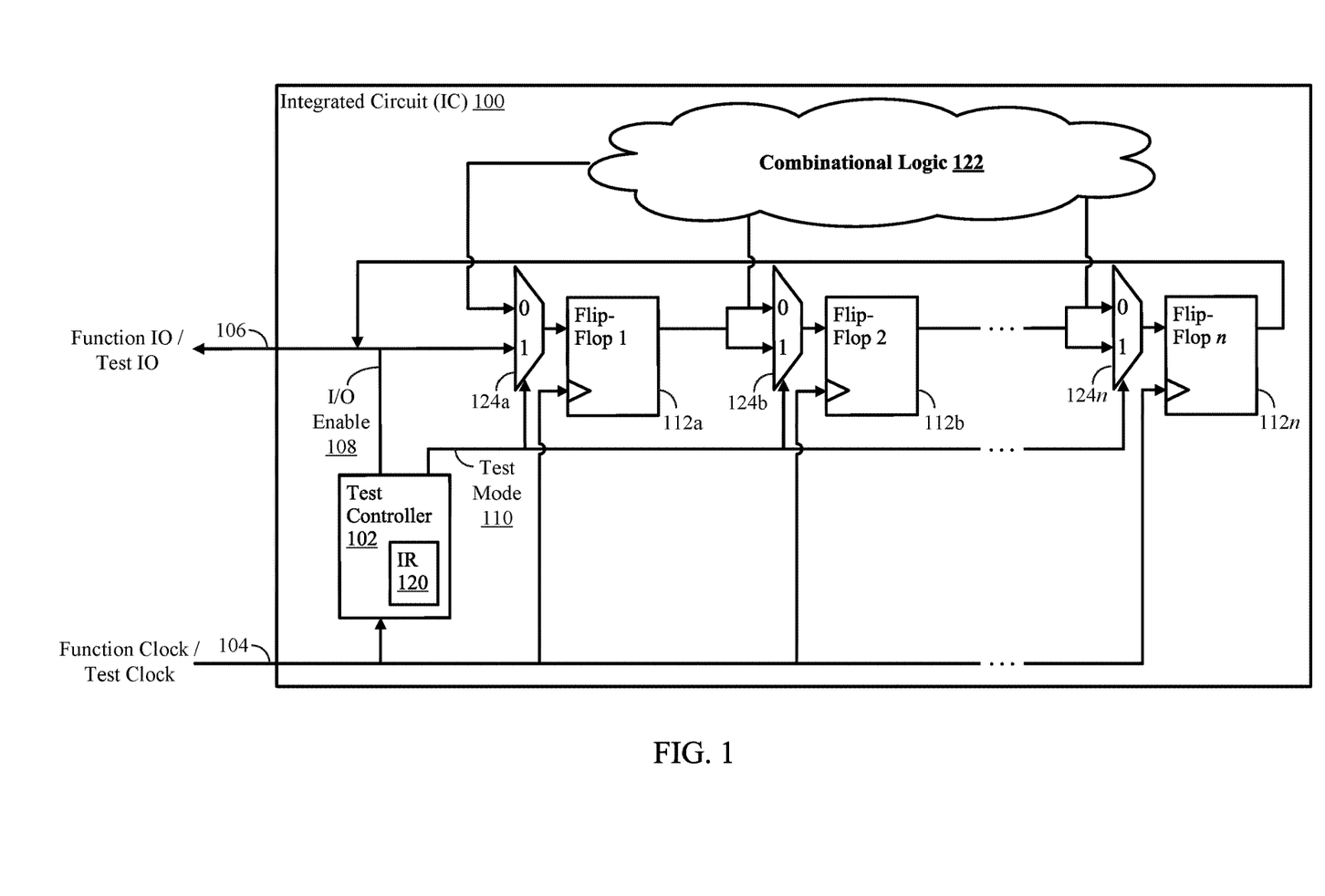
FIG. 1 is a block diagram illustrating an example integrated circuit (IC) and interconnections of elements within the IC, according to various aspects of the present disclosure.

FIG. 1 is a block diagram illustrating an example integrated circuit (IC) 100 containing an embedded test controller 102, according to certain aspects described herein.

In this example, IC 100 includes two pins (a first IC pin 104 and a second IC pin 106) configured to be used for normal operations (e.g., functional IC operations other than testing operations that support functionality of the IC), and configured to be reused for testing operations (e.g., I/O enable 108 and scan mode 110). In one example, first IC pin 104 is used for driving a functional clock configured to support normal operations of the IC 100. In certain aspects, first IC pin 104 can be reused for driving a test clock configured to support testing operations of test controller 102.

In certain aspects, second IC pin 106 is configured as a bidirectional I/O pin for shifting data into, and out of, a chain of data storage elements 112a-n (collectively referred to as data storage elements 112, and where n is an integer greater than 1) in IC 100. In some examples, the test controller 102 is configured to reuse the second IC pin 106 to support testing operations, such as scan-in, capture, and scan-out testing operations. Similarly, the first IC pin 104 is configured as a unidirectional pin for driving a functional mode clock signal into the circuit. In some examples, the test controller 102 is configured to reuse the first IC pin 104 to receive a test mode clock signal when the IC 100 is in a test mode.

In certain aspects, the test controller 102 includes an internal register (IR) 120 configured to indicate when the IC 100 is in a test mode or a functional/normal mode. In some examples, the IC 100 can receive a test initiation vector via the second IC pin 106. The test initiation vector may be configured to set the IR 120 of the test controller with a bit indicating that the IC 100 is in a test mode. By setting the IR 120 of the test controller, the test controller may initiate testing of the IC 100.

In some examples, a scan-in operation is a test operation configured for receiving a test vector (e.g., a set of data provided to the IC 100 in order to test the IC 100) via the second IC pin 106, and shift the test vector into the chain of data storage elements 112. In some examples, the scan-out operation is a test operation configured for shifting data out of the chain of data storage element 112 after a capture operation, and outputting the data via the second IC pin 106 which is a bidirectional pin. In some examples, the functional clock and test clock may be provided by another circuit or subsystem on a system-on-a-chip (SOC), or by external equipment.

In certain aspects, the chain of data storage elements 112 includes one or more flip-flop circuits or latch circuits that include at least two stable states and can be used to store vector data or state information. In some examples, the chain of data storage elements 112 may include two or more flip-flop circuits connected in a chain sharing a common clock (e.g., a normal function clock and/or test clock driven at the first IC pin 104), so that a data output of a first flip-flop feeds a data input of a second flip-flop.

The IC 100 may also include a combinational logic circuit 122 coupled to one or more multiplexers 124a-n at each data storage element 112.

In certain aspects, the test controller 102 is configured to generate signals, such as test mode 110 and I/O enable 108, which are configured to support test operations at the IC 100 when the IR 120 is set with a binary value indicative of testing operations. In testing operations, the test controller 102 may generate one or more test mode 110 signals (e.g., scan mode, capture mode, test mode, etc.) for testing the IC using scan-based DFT testing.

In some examples, test controller 102 includes a state machine configured to generate the test mode 110 signals. In another example, the test controller 102 may generate an I/O enable 108 signal configured to set an input or output direction of the bidirectional second IC pin 106.

In certain aspects, test vectors may be applied by automatic test equipment (ATE) outside of the IC 100. It should be noted that conventional DFT functions rely on a four-pin on ATE machine within an IC to apply scan vectors. In contrast, the disclosed IC 100 may receive test vectors from, and output test vectors to, a standard model outside of the IC 100. In some configurations, the ATE machine may be configured to translate generated test vectors to accommodate the two digital pins (e.g., first IC pin 104 and second IC pin 106) so that the translated test vectors can be used at IC 100 despite the limited digital pins.

In some examples, the test controller 102 may initiate a test of the IC 100 by generating a first signal (e.g., a test mode signal) configured to initiate a scan-in mode of the IC 100. For example, the IC 100 may receive a test initiation vector via the second IC pin 106. As noted above, the test initiation vector may be configured to set the IR 120 of the test controller with a bit indicating that the IC 100 is in a test mode. By setting the IR 120 of the test controller, the test controller may initiate testing of the IC 100.

The test controller 102 may also generate a second signal (e.g., an I/O enable signal) configured to set the second IC pin 106 to an input direction for receiving a test vector. The IC 100 may then receive a test vector via the second IC pin 106, and scan the test vector into the chain of data storage elements 112.

The test controller 102 may then generate a third signal (e.g., another test mode signal) configured to initiate a capture mode of the chain of data storage elements. In some examples, once the chain of data storage elements 112 contains the test vector, the test controller 102 may pause for a number of clock cycles (e.g., two clock cycles), then apply capture pulse to the chain of data storage elements 112. The test controller 102 may then pause again for a number of clock cycles (e.g., two clock cycles) so that the circuit operation settles to its new steady state. Notably, in other embodiments, other numbers of clock cycles may be used.

The test controller 102 may then generate a fourth signal (e.g., I/O enable signal) configured to change the second IC pin 106 from the input function to an output function.

The test controller 102 may also generate a fifth signal (e.g., test mode signal, or "scan mode") indicative of a scan-shift/capture operation. Accordingly, the chain of data storage elements 112 may output stored data via the second IC pin 106. This sequence of steps may be repeated for testing multiple test vectors.

In some configurations, the test controller 102 works together with the ATE machine, which applies the scan-in and scan-out test vectors and the corresponding test-clock for scan-in, scan-out, and capture mode. The test controller 102 generates and applies the corresponding test mode and I/O enable signals to support testing operations with the ATE machine. In some configurations, the test controller 102 is designed to be parameterized, and can be configured based on the design of the IC 100. For example, the test controller 102 can be designed based on the maximum depth of the chain of data storage elements 112 in the IC 100.

Figure 2:
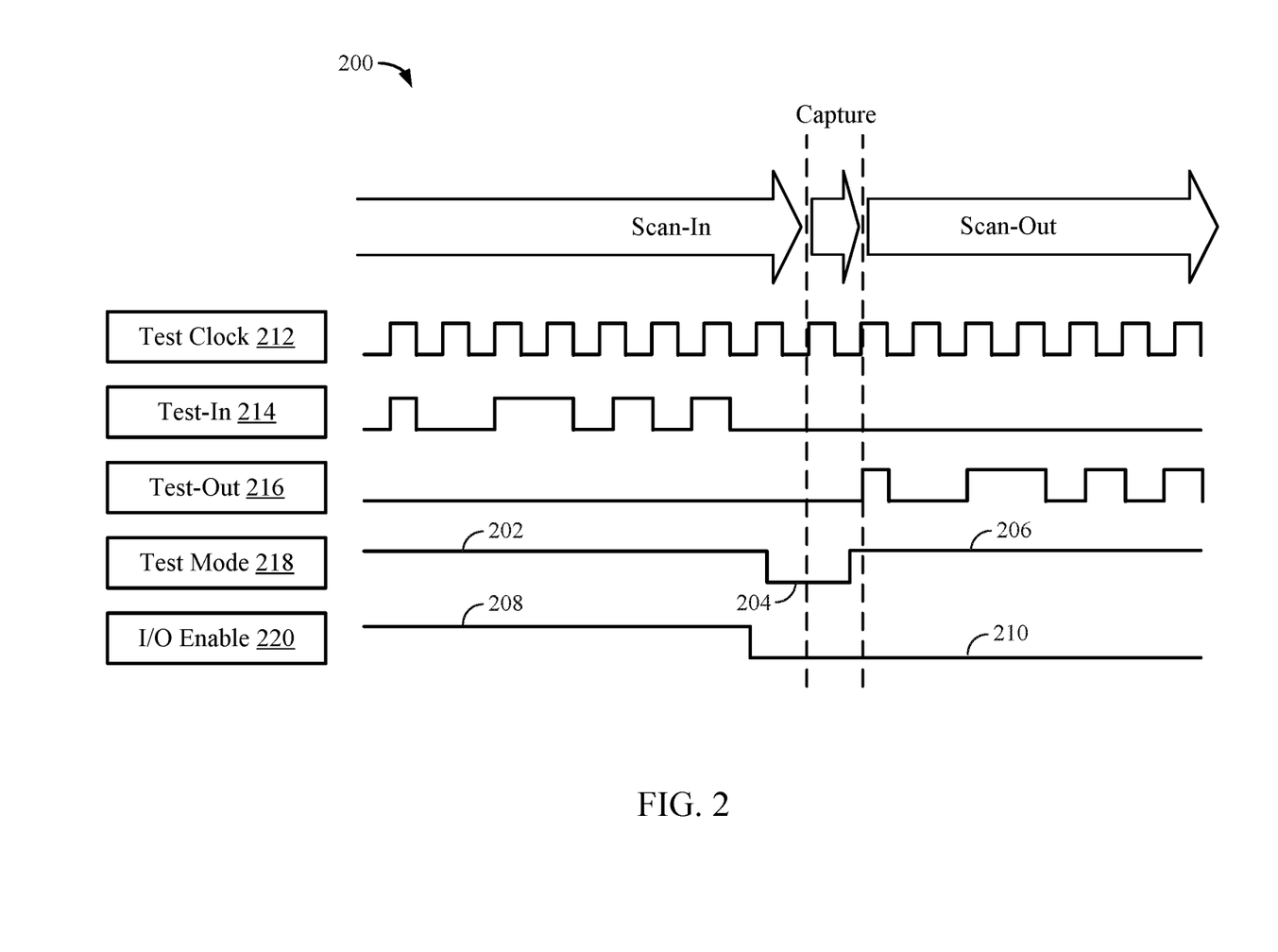
FIG. 2 is an example set of waveforms conceptually illustrating an example implementation for executing various aspects of an embedded test controller, according to various aspects of the present disclosure.

In certain aspects, the IC 100 may test the test controller 102. For example, upon powering the IC 100, IC 100 may execute a functional test of the test controller to verify functionality of the test controller 102. For example, the IC 100 may set one or more values of an internal register of the test controller 102. Each of the one or more values may be configured to test a signal generating functionality of the test controller 102. For example, setting the one or more values of the internal register may cause the internal register to generate a particular signal (e.g., a scan-in mode signal 202, a capture signal 204, a scan-out signal 206, an input mode signal 208, or an output mode signal 210).

FIG. 2 is a schematic illustrating an example set of waveforms 200 corresponding to certain processes described herein. When testing operations are initiated on an IC (e.g., IC 100 of FIG. 1), a test controller (e.g., test controller 102 of FIG. 1) embedded in the IC may generate test mode 218 signaling configured to put the IC into a particular test mode (or scan mode) for testing the IC. For example, the test controller may generate a scan-in mode signal 202, a capture signal 204, and a scan-out signal 206. The test controller may also generate an I/O enable 220 signal configured to set one or more pins of the IC to an input mode signal 208 (e.g., for receiving data at the pin), or an output mode signal 210 (e.g., for outputting data from the IC via the pin). The signals generated herein may include transistor-transistor logic (TTL) voltage signals or any other suitable logic signaling.

In some examples, a test clock signal 212 may be applied to a first IC pin (e.g., first IC pin 104 of FIG. 1) of the IC by an external ATE machine. The test clock signal 212 is configured to control a latch function of each data storage element in a chain of data storage elements (e.g., chain of data storage elements 112 of FIG. 1) during testing of the IC. In some examples, the test clock may be configured for a fixed frequency while in others it may be configured for different frequencies and/or periods based on the particular test mode. For example, for a capture operation, the clock frequency may be modulated or the period of the test clock frequency may be adjusted during the capture operation in order to accommodate settling of a chain of data storage elements before and after the capture operation.

In some examples, a test-in signal 214 may be applied to a second IC pin (e.g., second IC pin 106 of FIG. 1) by, for example, an external ATE machine. The test-in signal 214 may include a test vector configured to test the IC. In some configurations, the test vector includes test data configured to be read into the chain of data storage elements. Accordingly, the IC may receive a test vector via the second IC pin by a test-in signal. In some examples, a test-out signal 216 may be output by the IC via the second IC pin. The test-out signal 216 may include a read of the data contained in the chain of data storage elements. Accordingly, the test-in 214 signal and the test-out signal 216 may define the input and output of a scan test.

According to certain aspects, a test is initiated by a vector received by the IC that sets an internal register value of the test controller. The test controller may then generate an I/O enable 220 and a test mode 218 indicative of a test-in mode, or scan-in mode, for receiving, by the IC, a test vector. In one example, the I/O enable 220 indicates an input mode signal 208 configured the second IC pin to receive a test vector, and the test mode 218 indicates a scan-in mode signal 202 for configuring the chain of data storage elements to scan in the test vector. As shown in FIG. 2, the input mode signal 208 and the scan-in mode signal 202 is a high signal (e.g., a high TTL voltage), however, any suitable level of discrete logical signaling may be used to initiate the signaling described herein. Write to internal register 120 to initiate the scan test operation.

Once the IC is configured for scan-in test mode, a test-in signal 214 containing a test vector may be applied to the second IC pin of the IC by the external ATE machine. Because the I/O enable signal 220 is set to the input mode signal 208, the second IC pin can receive the test vector. And because the test mode 218 (or scan mode) is set to the scan-in mode 202 signal, the chain of data storage elements can receive the test vector.

Once the test vector is input into the chain of data storage elements, the test controller may generate a capture mode signal 204 and change the I/O enable 220 to an output mode signal 210. In this configuration, a capture pulse is applied to each element in the chain of data storage elements. The capture pulse may include a single clock cycle (e.g., a test clock 212 cycle) or any number of clock cycles (e.g., a low number such as 10 clock cycles) configured to capture the data values of the test vector within the chain of data storage elements.

Once the capture pulse has been applied, the test controller may generate a scan-out signal 206. In this configuration, the chain of data storage elements outputs the data stored in each element via the second IC pin. In some configurations, the stored data is output to the ATE. In this example, the test-out 216 signal is shown as identical to the test-in 214 signal. Such a result may indicate a properly functioning IC.

In some examples, the input mode signal 208 may be referred to as a first test signal. In some examples, the scan-in mode signal 202 may be referred to as a second test signal. In some examples, the capture mode signal 204 may be referred to as a third test signal. In some examples, the scan-out signal 206 may be referred to as a fourth test signal. In some examples, the output mode signal 210 may be referred to as a fifth test signal.

Figure 3:
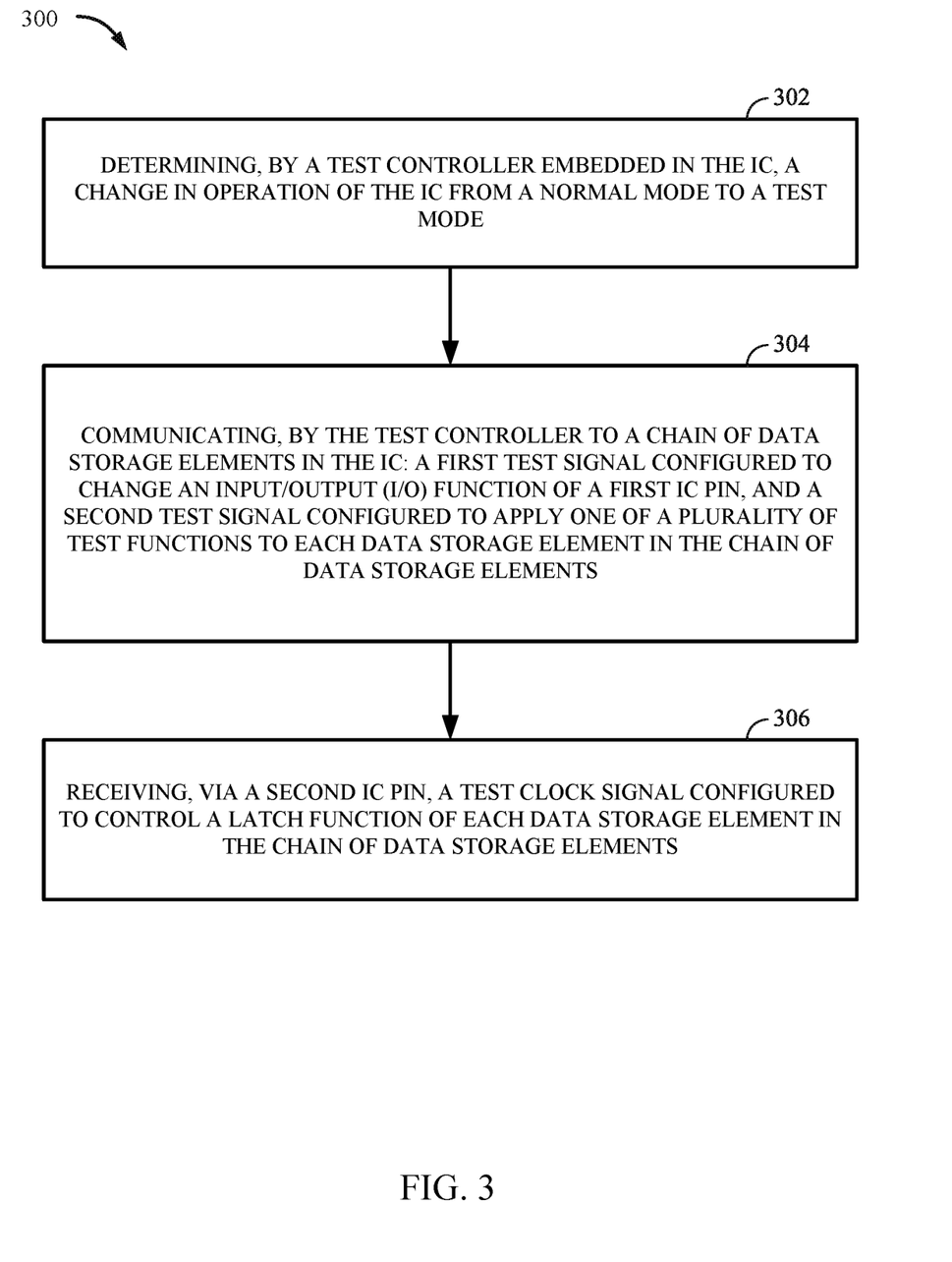
FIG. 3 is a flow chart illustrating an exemplary process for executing various aspects of the embedded test controller, according to various aspects of the present disclosure.

FIG. 3 is a flow diagram illustrating example operations 300 for performing testing operations by reusing two digital pins of an IC, in accordance with certain aspects of the present disclosure. Operations 300 may be implemented as software components that are executed and run on one or more processors.

The operations 300 begin, at step 302, by determining, by a test controller embedded in the IC, a change in operation of the IC from a normal mode to a test mode. For example, the IC 100 may receive a test initiation vector via the second IC pin 106. As noted above, the test initiation vector may be configured to set the IR 120 of the test controller with a bit indicating that the IC 100 is in a test mode. By setting the IR 120 of the test controller, the test controller may initiate testing of the IC 100.

The operations 300 then proceed to step 304, by communicating, by the test controller to a chain of data storage elements in the IC: a first test signal configured to change an input/output (I/O) function of a first IC pin, and a second test signal configured to apply one of a plurality of test functions to each of the data storage elements in the chain of data storage elements.

The operations 300 then proceed to step 306, by receiving, via a second IC pin, a test clock signal configured to control a latch function of each of the data storage elements in the chain of data storage elements.

In certain aspects, the first IC pin is configured to provide a path for: bidirectional communication during operation in the normal mode, and unidirectional communication during operation in the test mode, and the second IC pin is configured to receive a normal clock signal during operation in the normal mode, and a test clock signal during operation in the test mode.

In certain aspects, the operations 300 also include performing, by the IC, a controller test configured to verify functionality of the test controller prior to communication of the first test signal and the second test signal.

In certain aspects, determining the change in operation of the IC from the normal mode to the test mode includes receiving, by the IC, a first vector via the first pin while the IC is operating in the normal mode, wherein the first vector is configured to initiate the change in operation of the IC from the normal mode to the test mode by causing the IC to write a binary value to the test controller, and writing, by the IC, the binary value to the test controller.

In certain aspects, the operations 300 include receiving, at the first IC pin, a test vector, wherein the first test signal is configured to change the I/O function of the first IC pin to an input function configured to allow the first IC pin to receive the test vector, the second test signal is configured to apply a scan-in mode to each of the data storage elements in the chain of data storage elements, the scan-in mode is configured to enable the chain of data storage elements to receive the test vector, and the scan-in mode is one of the plurality of test functions.

In certain aspects, the operations 300 include communicating, by the test controller to the chain of data storage elements, a third test signal configured to apply a capture mode to each of the data storage elements in the chain of data storage elements, wherein the capture mode is configured to capture a corresponding portion of the test vector at each of the data storage elements in the chain of storage elements after the test vector is received. In this example, IC 100 includes two pins (a first IC pin 104 and a second IC pin 106) configured to be used for normal operations (e.g., functional IC operations other than testing operations that support functionality of the IC), and configured to be reused for testing operations (e.g., I/O enable 108 and scan mode 110). In one example, first IC pin 104 is used for driving a functional clock configured to support normal operations of the IC 100. In certain aspects, first IC pin 104 can be reused for driving a test clock configured to support testing operations of test controller 102.

In certain aspects, while in capture mode, the operations 300 include receiving, by the chain of data storage elements, a first number of clock cycles via the second IC pin, receiving, by the chain of data storage elements, a capture pulse via the second IC pin after the first number of clock cycles, and receiving, by the chain of data storage elements, a second number of clock cycles via the second IC pin prior to ending capture mode.

In certain aspects, the operations 300 include generating, by the test controller, a fourth signal configured to apply a scan-out mode to each of the data storage elements in the chain of data storage elements, wherein the scan-out mode is configured to enable the chain of data storage elements to output the captured test vector, and a fifth signal configured to change the I/O function of the first IC pin to an output function configured to allow the first IC pin to output the captured test vector, wherein the method further comprises communicating, by the test controller, the fourth signal and the fifth signal to the chain of data storage elements.

In certain aspects, the operations 300 include outputting the captured test vector from the chain of data storage elements via the first IC pin.

In certain aspects, the first IC pin is configured to provide: (i) an input path and an output path for shifting test vectors during a test mode, and (ii) the input path or the output path for shifting vectors during a normal operation mode, and the second IC pin is configured to provide a path for: (i) a test clock signal during the test mode, and (ii) a functional clock signal during the normal operation mode.

Figure 4:
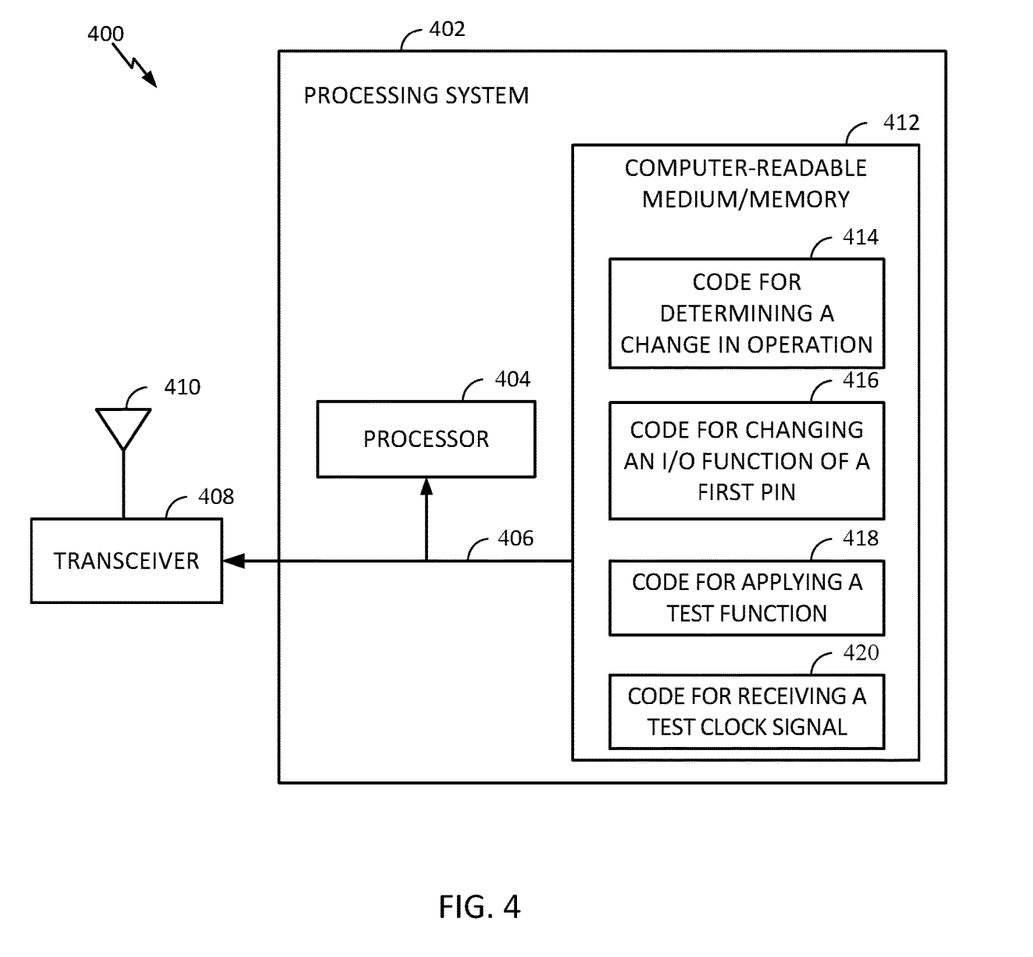
FIG. 4 illustrates a communications device that may include various components configured to perform opera-

FIG. 4 illustrates a communications device 400 that may include various components (e.g., corresponding to meansplus-function components) configured to perform operations for the techniques disclosed herein, such as the operations illustrated in FIG. 3. The communications device 400 includes a processing system 402 coupled to a transceiver 408. The transceiver 408 is configured to transmit and receive signals for the communications device 400 via an antenna 410. The processing system 402 may be configured to perform processing functions for the communications device 400, including processing signals received and/or to be transmitted by the communications device 400.

The processing system 402 includes a processor 404 coupled to a computer-readable medium/memory 412 via a bus 406. In certain aspects, the computer-readable medium/memory 412 is configured to store instructions (e.g., computer-executable code) that when executed by the processor 404, cause the processor 404 to perform the operations illustrated in FIG. 3, or other operations for performing the various techniques discussed herein for performing testing on a pin-limited integrated circuit using an embedded test controller. In certain aspects, computer-readable medium/memory 412 stores code 414 for determining a change in operation; code 416 for changing an I/O function of a first pin; code 418 for applying a test function; and code 420 for receiving a test clock signal.

In some configurations, the term(s) "communicate," "communicating," and/or "communication" may refer to "receive," "receiving," "reception," and/or other related or suitable aspects without necessarily deviating from the scope of the present disclosure. In some configurations, the term(s) "communicate," "communicating," "communication," may refer to "transmit," "transmitting," "transmission," and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. A method for testing an integrated circuit (IC), comprising:
   determining, by a test controller embedded in the IC, a change in operation of the IC from a normal mode to a test mode;
   communicating, by the test controller to a chain of data storage elements in the IC:
      a first test signal configured to change an input/output (I/O) function of a first IC pin, wherein the first IC pin provides an input path and an output path for: (i) shifting test vectors during a test mode, and (ii) shifting vectors during the normal mode; and
      a second test signal configured to apply one of a plurality of test functions to each data storage element in the chain of data storage elements; and
   receiving, via a second IC pin, a test clock signal configured to control a latch function of each data storage element in the chain of data storage elements, wherein the second IC pin provides a path for: (i) the test clock signal during the test mode, and (ii) a functional clock signal during the normal mode.

2. The method of claim 1, wherein:
   the first IC pin is configured to provide a path for: bidirectional communication during operation in the normal mode, and unidirectional communication during operation in the test mode, and
   the second IC pin is configured to receive: a normal clock signal during operation in the normal mode, and the test clock signal during operation in the test mode.

3. The method of claim 1, further comprising performing, by the IC, a controller test configured to verify functionality of the test controller prior to communication of the first test signal and the second test signal.

4. The method of claim 1, wherein determining the change in operation of the IC from the normal mode to the test mode comprises:
   receiving, by the IC, a first vector via the first IC pin while the IC is operating in the normal mode, wherein the first vector is configured to initiate the change in operation of the IC from the normal mode to the test mode by causing the IC to write a binary value to an internal register of the test controller; and
   writing, by the IC, the binary value to the internal register of the test controller.

5. The method of claim 1, further comprising:
   receiving, at the first IC pin, a test vector, wherein:
      the first test signal is configured to change the I/O function of the first IC pin to an input function configured to allow the first IC pin to receive the test vector,
      the second test signal is configured to apply a scan-in mode to each data storage element in the chain of data storage elements,
      the scan-in mode is configured to enable the chain of data storage elements to receive the test vector, and
      the scan-in mode is one of the plurality of test functions.

6. The method of claim 5, further comprising:
   communicating, by the test controller to the chain of data storage elements, a third test signal configured to apply a capture mode to each data storage element in the chain of data storage elements, wherein the capture mode is configured to capture a corresponding portion of the test vector at each data storage element in the chain of data storage elements after the test vector is received; and
   capturing the test vector in the chain of data storage elements.

7. The method of claim 6, wherein, the method further comprises: while in the capture mode:
   receiving, by the chain of data storage elements, a first number of clock cycles via the second IC pin;
   receiving, by the chain of data storage elements, a capture pulse via the second IC pin after the first number of clock cycles; and
   receiving, by the chain of data storage elements, a second number of clock cycles via the second IC pin prior to ending capture mode.

8. The method of claim 6, further comprising generating, by the test controller:
   a fourth test signal configured to apply a scan-out mode to each data storage element in the chain of data storage elements, wherein the scan-out mode is configured to enable the chain of data storage elements to output the captured test vector; and
   a fifth test signal configured to change the I/O function of the first IC pin to an output function configured to allow the first IC pin to output the captured test vector,
   wherein the method further comprises communicating, by the test controller, the fourth test signal and the fifth test signal to the chain of data storage elements.

9. The method of claim 8, further comprising outputting the captured test vector from the chain of data storage elements via the first IC pin.

10. The method of claim 5, wherein the test vector is received from test equipment external to the IC.

11. An apparatus for testing an integrated circuit (IC), comprising:
   a memory; and
   a test controller embedded in the IC and communicatively coupled to the memory, wherein the test controller is configured to:
      determine a change in operation of the IC from a normal mode to a test mode;
      communicate to a chain of data storage elements in the IC:
         a first test signal configured to change an input/output (I/O) function of a first IC pin, wherein the first IC pin is configured to provide an input path and an output path for: (i) shifting test vectors during a test mode, and (ii) shifting vectors during the normal mode, and
         a second test signal configured to apply one of a plurality of test functions to each data storage element in the chain of data storage elements; and
      receive, via a second IC pin, a test clock signal configured to control a latch function of each data storage element in the chain of data storage elements, wherein the second IC pin provides a path for: (i) the test clock signal during the test mode, and (ii) a functional clock signal during the normal mode.

12. The apparatus of claim 11, wherein:
   the first IC pin is configured to provide a path for: bidirectional communication during operation in the normal mode, and unidirectional communication during operation in the test mode, and the second IC pin is configured to receive: a normal clock signal during operation in the normal mode, and the test clock signal during operation in the test mode.

13. The apparatus of claim 11, wherein the test controller is further configured to perform a test configured to verify functionality of the test controller prior to communication of the first test signal and the second test signal.

14. The apparatus of claim 11, wherein the IC is configured to:

receive a first vector via the first IC pin while the IC is operating in the normal mode, wherein the first vector is configured to initiate the change in operation of the IC from the normal mode to the test mode by causing the IC to write a binary value to the test controller; and write the binary value to the test controller.

15. The apparatus of claim 11, wherein the IC is configured to:

receive, at the first IC pin, a test vector, wherein:

the first test signal is configured to change the I/O function of the first IC pin to an input function configured to allow the first IC pin to receive the test vector, the second test signal is configured to apply a scan-in mode to each data storage element in the chain of data storage elements, the scan-in mode is configured to enable the chain of data storage elements to receive the test vector, and the scan-in mode is one of the plurality of test functions.

16. The apparatus of claim 15, wherein the test controller is further configured to:

communicate a third test signal configured to apply a capture mode to each data storage element in the chain of data storage elements, wherein the capture mode is configured to capture a corresponding portion of the test vector at each data storage element in the chain of data storage elements after the test vector is received; and capture the test vector in the chain of data storage elements.

17. The apparatus of claim 16, wherein, while in capture mode, the chain of data storage elements are configured to:

receive a first number of clock cycles via the second IC pin;

receive a capture pulse via the second IC pin after the first number of clock cycles; and receive a second number of clock cycles via the second IC pin prior to ending capture mode.

18. The apparatus of claim 16, wherein the test controller is further configured to generate:

a fourth signal configured to apply a scan-out mode to each data storage element in the chain of data storage elements, wherein the scan-out mode is configured to enable the chain of data storage elements to output the captured test vector; and a fifth signal configured to change the I/O function of the first IC pin to an output function configured to allow the first IC pin to output the captured test vector, wherein the test controller is further configured to communicate the fourth signal and the fifth signal to the chain of data storage elements.

19. The apparatus of claim 18, wherein the IC is configured to output the captured test vector from the chain of data storage elements via the first IC pin.

20. A non-transitory computer-readable storage medium containing a program which, when executed by one or more processors, performs operations for testing an integrated circuit (IC), the operations comprising:

determining a change in operation of the IC from a normal mode to a test mode;

communicating to a chain of data storage elements in the IC:

a first test signal configured to change an input/output (I/O) function of a first IC pin, wherein the first IC pin provides an input path and an output path for: (i) shifting test vectors during a test mode, and (ii) shifting vectors during the normal mode, and a second test signal configured to apply one of a plurality of test functions to each data storage element in the chain of data storage elements; and receiving, via a second IC pin, a test clock signal configured to control a latch function of each data storage element in the chain of data storage elements, wherein the second IC pin provides a path for: (i) the test clock signal during the test mode, and (ii) a functional clock signal during the normal mode.

* * * * *